United States Patent [19]

Gilissen et al.

[11] 3,954,317

[45] May 4, 1976

[54] ELASTOMERIC CONNECTOR AND ITS METHOD OF MANUFACTURE

[75] Inventors: Hermanus Petrus Johannes Gilissen, Esch; Petrus Richardus Martinus van Dijk, 's-Hertogenbosch, both of Netherlands

[73] Assignee: AMP Incorporated, Harrisburg, Pa.

[22] Filed: Feb. 11, 1975

[21] Appl. No.: 549,108

[30] Foreign Application Priority Data

Feb. 27, 1974 Netherlands ........................ 7402641

[52] U.S. Cl. ............................ 339/17 E; 339/17 M; 339/59 M

[51] Int. Cl.² ............................................ H05K 1/12

[58] Field of Search ............... 339/17 R, 17 E, 17 L, 339/17 M, 17 LM, 48, 49, 59–61, 204, 205, 208

[56] References Cited

UNITED STATES PATENTS

| | | | |
|---|---|---|---|
| 2,801,399 | 7/1957 | Dunn et al. | 339/61 R X |
| 3,611,251 | 10/1971 | Downhill | 339/17 M |
| 3,795,037 | 3/1974 | Luttmer | 339/59 M |
| 3,795,884 | 3/1974 | Kotaka | 339/17 LM |

OTHER PUBLICATIONS

Bresg, "Spring Contactor;" IBM Technical Disclosure Bulletin, Vol. 10, No. 4; Sept. 1967; p. 363.

*Primary Examiner*—Joseph J. McGlynn
*Assistant Examiner*—Craig R. Feinberg
*Attorney, Agent, or Firm*—William J. Keating; Jay L. Seitchik; Frederick W. Raring

[57] ABSTRACT

A matrix connector comprises an elastomer body presenting a pair of opposite contact faces at each of which is disposed a multiplicity of spaced contacts, contacts of opposite faces being interconnected by conductors extending through the body and being defined by convex folds in the conductors. Individual rows of contacts and their conductors are formed on flexible printed circuit laminae of which edge portions are turned to define the folds. A stack of laminae alternating with elastomeric strip material define the connector. Manufacture is suitably by compressing such a stack of extrude the elastomer through apertures in the printed circuits and curing the elastomer into a homogeneous mass.

2 Claims, 7 Drawing Figures

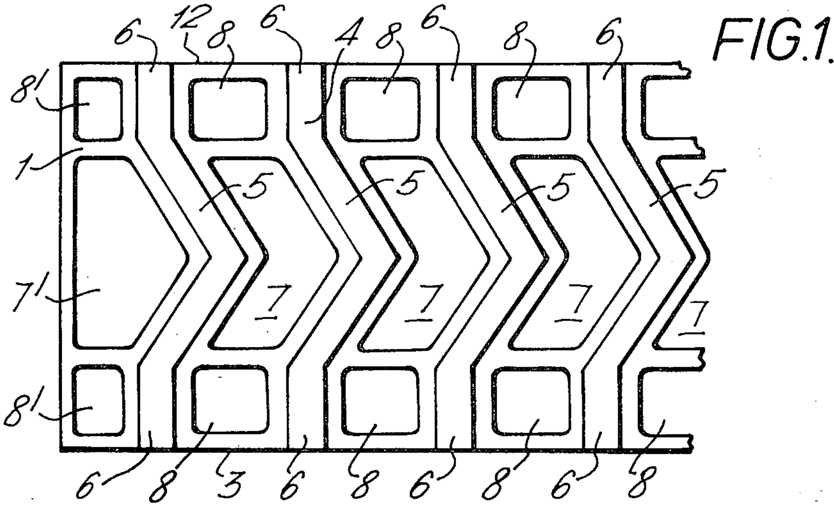
FIG.1.
FIG.2.
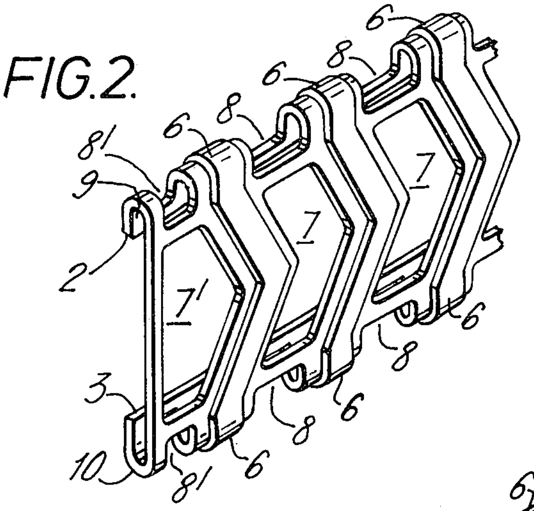
FIG.3.
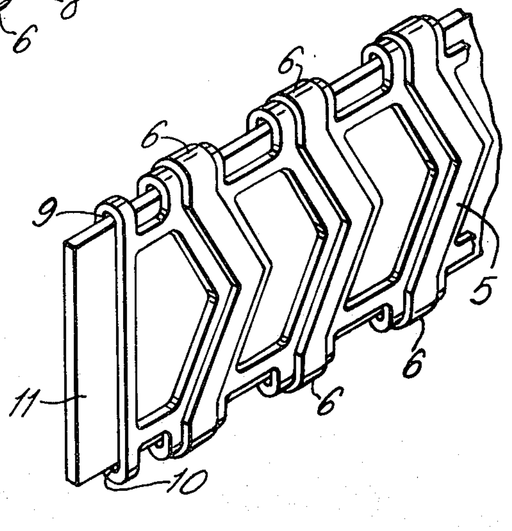
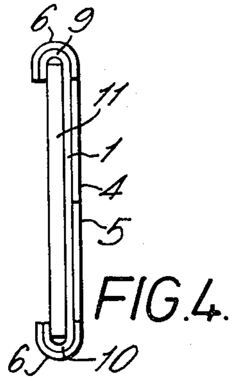
FIG.4.

ELASTOMERIC CONNECTOR AND ITS METHOD OF MANUFACTURE

This invention concerns an electrical connector and its method of manufacture and is particularly concerned with matrix connectors of the kind described in our U.S. patent application Ser. No. 490,621.

In our U.S. patent application Ser. No. 490,621, we disclosed and claimed a matrix connector comprising an elastomer body presenting a pair of opposite contact surfaces at each of which is disposed a multiplicity of spaced contacts, the contacts of the opposite faces being interconnected by conductors extending through the body, characterized by the contacts being defined by folds of flat metal strips extending through the elastomeric mass to interconnect contacts at the opposite contact surfaces.

We also disclosed and claimed a method of manufacture of such a connector characterized by forming a lamina flexible printed circuit with sets of conductive strips on opposite sides with portions of sets at opposite sides overlapping and forming apertures in the insulating lamina of the printed circuit, interconnecting the overlapping portions through holes in the insulating lamina of the printed circuit, folding the printed circuit in concertina fashion with sets of conductive strips extending externally around the folds of the concertina, spacing adjacent limbs of the concertina form with strip-like partially cured elastomer material and compressing the concertina longitudinally to effect extrusion of the elastomer through the apertures in the printed circuit lamina and into troughs of the concertina form, and curing the elastomer to a homogeneous mass.

It is an object of the invention to present an improved connector according to our earlier application which may more easily and economically be manufactured.

According to the present invention a connector according to claim 1 of our U.S. patent application Ser. No. 490,621, is further characterized in that individual rows of contacts and their associated conductors are formed as circuits on respective lamina flexible printed circuits of strip-like form, each strip-like printed circuit lamina having the circuits on one side only of the strip and extending substantially between side edges of the strip, side edge portions of the strip being folded over onto the side devoid of the circuits and the conductors extending externally around the folded side-edge portions, a plurality of such strip-like printed circuits being disposed in generally parallel spaced relationship within the body of elastomeric material, the folded conductor portions being exposed at opposite faces of the elastomer body to define the spaced contacts.

A method of manufacture of such a connector is characterized by forming a plurality of strip-like flexible lamina printed circuits, each strip-like printed circuit lamina having circuit paths on one side only, the circuit paths comprising conductive strips spaced longitudinally of the strip-like lamina and each extending transversely between opposite side edge portions of the strip, forming apertures in the insulating lamina, folding over the opposite side edge portions of each strip onto the side of the lamina devoid of circuit paths so that the transverse conductors extend externally of the folds disposing between the opposite folds of each strip-like printed circuit and adjacent the side devoid of circuits a first strip of partially cured or thermoplastic elastomeric insulating material, positioning the assemblies of printed circuit laminae and first elastomeric strips in a stack alternating with second strips of elastomeric insluating material, compressing the stack to effect extrusion of the first and second elastomeric strips through the apertures of the printed circuit laminae and into troughs within the folded side edge portions, and curing the elastomer into a homogeneous mass encasing the printed circuit laminae with convex portions of the folded conductors exposed at opposite faces of the elastomeric mass.

The invention will now be described by way of example with reference to the accompanying partly digrammatic drawings, in which:

FIG. 1 is a fragmentary plan view of an end portion of a strip-like flat-flexible printed circuit for use in a connector manufacture according to the invention;

FIG. 2 is a fragmentary end perspective view of the circuit member of FIG. 1 after a first stage of further manufacture;

FIG. 3 is a view similar to that of FIG. 1 of a further stage of manufacture;

FIG. 4 is an end view of the circuit member in the FIG. 3 stage;

Figure 5:
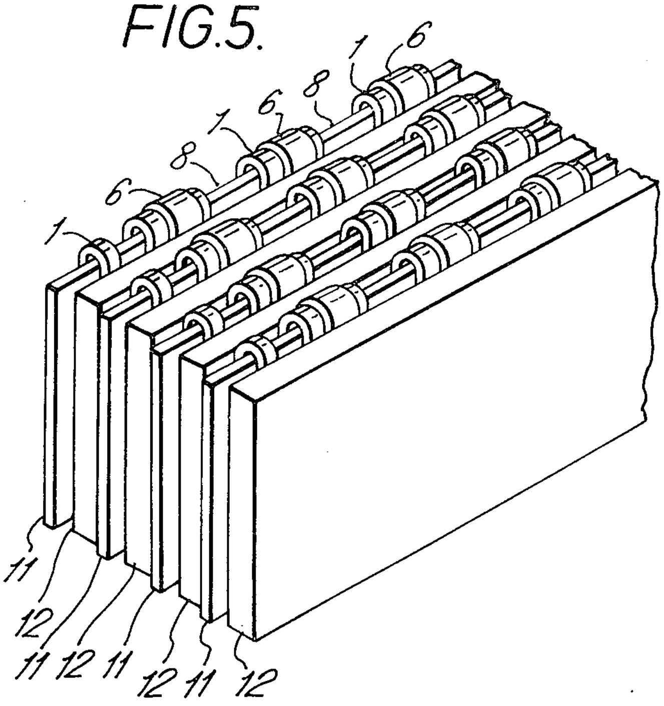
FIG. 5 is a view similar to FIG. 3 of a plurality of circuit members in yet further stage of manufacture.

The flat flexible circuit member of FIG. 1 comprises a lamina 1 of flexible insulating material and of strip-like form having a uniform width between parallel side edges 2, 3 and extending longitudinally.

The insulating member 1 is formed on one side only with printed circuit conductors 4 extending transversely of the strip 1 between the side edges 2, 3 at uniform intervals along the strip 1. Each conductor 4 is of generally rectangular section and strip-like form and has a chevron-shaped central portion 5 comprising arms which diverge from the longitudinal axis of the strip 1 to aligned end portions 6 which extend normally to the side edges 2, 3.

The insulating strip member 1 is formed intermediate adjacent conductor portions 5 with chevron-shaped apertures 7 having arms parallel to those of the chevron portion 5 and terminating short of the side edges 2, 3. Further apertures 8 of generally rectangular form, are formed between adjacent conductor end portions 6 and between the side edges 2, 3 of the insulating strip and outer extremities of the chevron apertures 7.

Apertures 7' and 8' are formed at the end of the strip 1 to terminate the strip 1 in a straight end.

In a first forming stage, the side edge portions 2, 3 of the flexible printed circuit are folded over as shown in FIG. 2 against the side of the insulating member devoid of conductive strips 4, to define folds 9, 10 intersecting the apertures 8 and the conductor portions 6 which extend externally of the folds in convex manner.

In a second forming stage as shown in FIGS. 3 and 4 a strip 11 of partially cured elastomeric material is disposed between the folds 9, 10 and adjacent the side of the insulating member 1 devoid of conductors 4.

The steps of FIGS. 2 and 3 may be carried out simultaneously by feeding the elastomer strip 11 between the folds 9, 10 as the folds are progressively formed.

Figure 6:
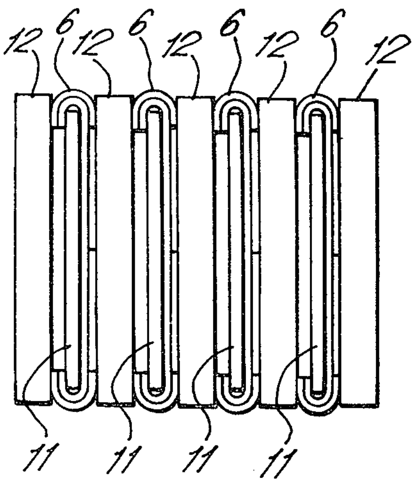
FIG. 6 is an end view of the assembly of FIG. 5.

Following the steps of FIGS. 3 and 4, several printed circuit members 1 in association with elastomer strips 11 are stacked side-by-side as shown in FIGS. 5 and 6 with alternate further strips of elastomer 12 which is suitably of the same nature as that of strips 11. The stack may be of a number of layers selected according to the size of connector required and, as shown in FIG. 6 is provided with layers 12 of elastomer at both ends of the stack. The strips of elastomer 11 and 12 extend beyond the ends of the printed circuit members.

The assembly of FIGS. 5 and 6 is then suitably compressed through the stack to effect extrusion of the elastomer 11, 12 through the apertures 7 and into the folds 9, 10 and apertures 8. The compression is suitably carried out within a confined chamber having plates registered with the upper and lower side faces 13, 14 of the stack as seen in FIG. 6 and engaging the convexly curved conductive portions 6. The pressure of the extruded elastomer within the folds 9, 10 serves to hold the conductor portions 6 against the plates and prevent flow of elastomer through apertures 8 from encasing the conductor portions 6.

Figure 7:
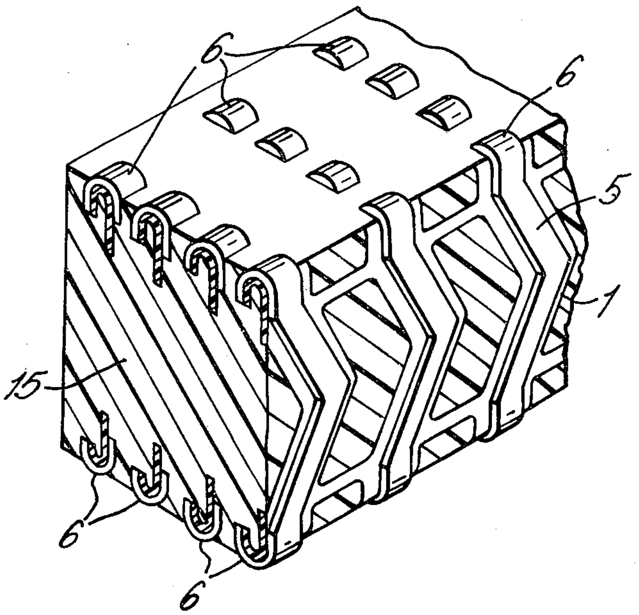
FIG. 7 is a fragmentary partly sectioned perspective view of a matrix connector in a final stage of manufacture.

The compressed elastomer 11, 12 is the suitably cured to a homogeneous mass 15 as shown in FIG. 7 with the arcuate conductor portions 6 exposed at intervals in grid array across the upper and lower surfaces 13, 14 to define contacts interconnected in pairs of opposite contacts by the conductive chevron portions 5.

The flexible printed circuit may comprise a lamina 1 of polyester such as MYLAR formed with copper conductive tracks 4 overplated with contact metal such as gold. Examples of suitable elastomeric material for use in the manufacture described in a partially cured state are Butyl Rubber, B-stage polyurethane and other partly cured rubbers embodying a cross-linking agent.

As an alternative to the use of partially cured elastomer, it is also practical to use thermoplastic rubbers for example Butadieen-Skyreen rubbers, which do not require curing. Bonding of the first and second strips of elastomer into a homogeneous mass is achieved under suitable temperature and pressure in a similar way.

What is claimed is:

1. A matrix connector comprising an elastomer body presenting a pair of opposite contact surfaces at each of which is disposed a multiplicity of spaced contacts, the contacts of the opposite faces being interconnected by conductors extending through the body and being defined by folds of flat metal strips extending through the elastomeric mass to interconnect the contacts at the opposite surfaces, in which individual rows of contacts and their associated conductors are formed as circuits on respective lamina flexible printed circuits of strip-like form, each strip-like printed circuit lamina having the circuits on one side only of the strip and extending substantially between side edges of the strip, side edge portions of the strip being folded over onto the side devoid of the circuits and the conductors extending externally around the folded side-edge portions, a plurality of such strip-like printed circuits, being disposed in generally parallel spaced relationship within the body of elastomeric material, the folded conductor portions being exposed at opposite faces of the elastomer body to define the spaced contacts.

2. A connector as claimed in claim 1, in which the conductors on each printed circuit strip are of chevron-shape comprising a pair of arms extending in inclined manner from a central portion of the strip towards the side edge portions, slot-like apertures in the printed circuit insulating lamina of chevron form, being disposed between adjacent conductors with limbs of the slots terminating short of the side edges, further apertures in the insulating lamina being disposed between marginal portions adjacent the conductors and outwardly of extremities of the chevron slots, the further apertures bridging the folds of the strip side portions at the opposite faces of the elastomer mass.

* * * * *